United States Patent
Zheng et al.

(10) Patent No.: US 6,746,591 B2
(45) Date of Patent: Jun. 8, 2004

(54) ECP GAP FILL BY MODULATING THE VOLTATE ON THE SEED LAYER TO INCREASE COPPER CONCENTRATION INSIDE FEATURE

(75) Inventors: Bo Zheng, San Jose, CA (US); Renren He, Sunnyvale, CA (US); Girish Dixit, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 135 days.

(21) Appl. No.: 09/981,508

(22) Filed: Oct. 16, 2001

(65) Prior Publication Data

US 2004/0045831 A1 Mar. 11, 2004

(51) Int. Cl.$^7$ .................................................. C25D 5/18
(52) U.S. Cl. ...................... 205/104; 205/102; 205/103; 205/118; 205/123
(58) Field of Search ................................ 205/102, 103, 205/104, 118, 123

(56) References Cited

U.S. PATENT DOCUMENTS

| | | | |
|---|---|---|---|
| 3,410,774 A | 11/1968 | Barson et al. | 204/192 |
| 4,756,801 A | 7/1988 | Jokinen et al. | 162/175 |
| 4,865,712 A | 9/1989 | Mintz | 204/298 |
| 4,874,493 A | 10/1989 | Pan | 204/192.11 |
| 4,874,494 A | 10/1989 | Ohmi | 204/192.12 |
| 4,963,239 A | 10/1990 | Shimamura et al. | 204/192.12 |
| 4,999,096 A | 3/1991 | Nihei et al. | 204/192.3 |
| 5,078,847 A | 1/1992 | Grosman et al. | 204/192.31 |
| 5,126,028 A | 6/1992 | Hurwitt et al. | 204/192.13 |
| 5,256,274 A | 10/1993 | Poris | 205/123 |
| 5,262,354 A | 11/1993 | Cote et al. | 437/195 |

(List continued on next page.)

FOREIGN PATENT DOCUMENTS

| | | |
|---|---|---|
| EP | 0 123 456 A2 | 10/1984 |
| EP | 0 297 502 A2 | 6/1988 |
| EP | 0 798 778 A2 | 10/1997 |
| EP | 0 892 428 A2 | 1/1999 |
| EP | 0 788 160 A3 | 6/1999 |

OTHER PUBLICATIONS

US 5,863,392, 1/1999, Drummond et al. (withdrawn)

L. J. Kochel, "Pressure control of rf bias for sputtering", Rev. Sci. Instrm., vol. 47, No. 12, (Dec. 1976), pp. 1555–1557.

(List continued on next page.)

*Primary Examiner*—Wesley A. Nicolas
(74) *Attorney, Agent, or Firm*—Moser, Patterson & Sheridan (57) ABSTRACT

A method and apparatus for electrochemically depositing a metal onto a substrate. The apparatus generally includes a head assembly having a cathode and a wafer holder disposed above the cathode. The apparatus further includes a process kit disposed below the head assembly, the process kit including an electrolyte container configured to receive and maintain a fluid electrolyte therein, and an anode disposed in the electrolyte container. The apparatus further includes a power supply in electrical communication with the cathode and the anode, the power supply being configured to provide a varying amplitude electrical signal to the anode and cathode. The method generally includes providing an electrolyte container configured to receive and maintain a fluid electrolyte therein, the electrolyte container having an anode disposed within the electrolyte container, providing a head assembly positioned above the electrolyte container, the head assembly including a wafer holder for supporting a wafer and a cathode, and positioning a wafer in the electrolyte container in contact with the fluid electrolyte, and applying a varying amplitude waveform to the cathode and anode in an electroplating process.

28 Claims, 5 Drawing Sheets

U.S. PATENT DOCUMENTS

| | | | |
|---|---|---|---|
| 5,302,266 A | 4/1994 | Grabarz et al. | 204/192.12 |
| 5,303,139 A | 4/1994 | Mark | 363/63 |
| 5,346,600 A | 9/1994 | Nieh et al. | 204/192.3 |
| 5,376,584 A | 12/1994 | Agarwala | 437/183 |
| 5,486,492 A | 1/1996 | Yamamoto et al. | 437/192 |
| 5,510,011 A | 4/1996 | Okamura et al. | 204/192.3 |
| 5,584,974 A | 12/1996 | Sellers | 204/192.13 |
| 5,585,673 A | 12/1996 | Joshi et al. | 257/751 |
| 5,585,974 A | 12/1996 | Shrinkle | 360/46 |
| 5,612,254 A | 3/1997 | Mu et al. | 437/195 |
| 5,620,581 A | 4/1997 | Ang | |
| 5,639,357 A | 6/1997 | Xu | 204/192.3 |
| 5,651,865 A | 7/1997 | Sellers | 204/192.13 |
| 5,662,788 A | 9/1997 | Sandhu et al. | 205/87 |
| 5,693,563 A | 12/1997 | Teong | 437/190 |
| 5,718,813 A | 2/1998 | Drummond et al. | 204/192.12 |
| 5,723,387 A | 3/1998 | Chen | 438/692 |
| 5,725,739 A | 3/1998 | Hu | 204/192.3 |
| 5,731,245 A | 3/1998 | Joshi et al. | 438/705 |
| 5,744,376 A | 4/1998 | Chan et al. | 437/190 |
| 5,759,906 A | 6/1998 | Lou | 438/623 |
| 5,770,023 A | 6/1998 | Sellers | 204/192.3 |
| 5,780,357 A | 7/1998 | Xu et al. | 438/639 |
| 5,807,467 A | 9/1998 | Givens et al. | 204/192.12 |
| 5,810,963 A | 9/1998 | Tomioka | 156/345 |
| 5,810,982 A | 9/1998 | Sellers | 204/298.08 |
| 5,858,184 A | 1/1999 | Fu et al. | 204/192.17 |
| 5,904,565 A | 5/1999 | Nguyen et al. | 438/687 |
| 5,911,864 A | 6/1999 | Eldridge | 205/124 |
| 5,933,753 A | 8/1999 | Simon et al. | 438/629 |
| 5,966,634 A | 10/1999 | Inohara et al. | 438/687 |
| 5,968,327 A | 10/1999 | Kobayashi et al. | 204/298.11 |
| 5,972,192 A | 10/1999 | Dubin et al. | |
| 5,976,327 A | 11/1999 | Tanaka | 204/192.15 |
| 6,001,420 A | 12/1999 | Mosely et al. | 427/258 |
| 6,027,631 A | 2/2000 | Broadbent | |
| 6,048,445 A | 4/2000 | Brain | 205/118 |
| 6,051,114 A | 4/2000 | Yao et al. | 204/192.3 |
| 6,071,814 A | 6/2000 | Jang | 438/687 |
| 6,126,798 A | 10/2000 | Reid et al. | |
| 6,133,619 A | 10/2000 | Sahota et al. | 257/649 |
| 6,149,974 A | 11/2000 | Nguyen et al. | 427/255.29 |
| 6,179,983 B1 | 1/2001 | Reid et al. | |
| 6,197,179 B1 * | 3/2001 | Arlt et al. | 205/108 |
| 6,224,737 B1 | 5/2001 | Tsai et al. | 205/123 |
| 6,248,222 B1 | 6/2001 | Wang | |
| 6,261,433 B1 | 7/2001 | Landau | |
| 6,368,966 B1 | 4/2002 | Krishnamoorthy et al. | |
| 6,391,166 B1 | 5/2002 | Wang | |
| 6,432,821 B1 | 8/2002 | Dubin et al. | 438/678 |
| 6,527,920 B1 | 3/2003 | Mayer et al. | |
| 6,551,483 B1 | 4/2003 | Mayer et al. | |
| 2002/0000380 A1 | 1/2002 | Graham et al. | |
| 2003/0038036 A1 * | 2/2003 | Collins | 205/103 |

OTHER PUBLICATIONS

Suzuki, et al., "Microwave plasma etching", Pergamon Press Ltd., vol. 34, No. 10/11 (1984) pp. 953–957 No month avail.

Rossnagel, et al., Collimated magnetron sputter deposition with grazing angle ion bombardment, J. Vac. Sci Tech, vol. 13, No. 1 (Jan./Feb. 1995), pp. 156–158.

Yasui, et al., "Electron cyclotron resonance plasma generation using a planar ring–cusp magnetic field and reentrant coaxial cavity", J. Vac. Sci. Tech., vol. 13, No. 4 (Jul./Aug. 1995), pp. 2105–2109.

Holber, et al., "Copper deposition by electron cyclotron resonance plasma", J. Vac. Sci. Tech., vol. 11, No. 6 (Nov./Dec. 1993), pp. 2903–2910.

Cheng, et al., "Directional deposition of Cu into semiconductor trench structures using ionized magnetron sputtering", J. Vac. Sci. Tech., Vol 13, No. 2 (Mar./Apr. 1995), pp. 203–208.

P. Kidd, "A Magnetically confined and electron cyclotron resonance heated plasma machine for coating and ion surface modification use", J. Vac. Sci. Tech., vol. 9, No. 3(May/Jun. 1991), pp. 466–473.

M. Yamashita, "Fundamental characteristics of built–in high–frequency coil–type sputtering apparatus", *J. Vac. Sci. Tech.*, (Mar./Apr. 1989), pp. 151–158.

S. Samukawa, "Wave propagation and plasma uniformity in an electron cyclotron resonance plasma", *J. Vac. Sci. Tech.*, 11(5) (Sep./Oct. 1993), pp. 2572–2576.

Apblett, et al., "Silicon nitride growth in a high–density plasma system", *Solid State Tech*, (Nov. 1995), pp. 73–74 & 78 and 80.

Suzuki, et al., Microwave Plasma Etching, *J. App. Phys*, 16(11) (Nov. 1977), pp. 1979–1984.

Getty, et al., "Size–scalable 2.45 GHz electron cyclotron resonance plasma source using permanent magnets and waveguide coupling", J. Vac. Sci. Tech., 12(1) (Jan./Feb. 1994), pp. 408–415.

Hamaguchi, et al., Simulations of trench–lling pros les under ionized magnetron sputter metal deposition;, *J. Vac. Sci. Tech*, 13(2) (Mar./Apr. 1995), pp. 183–191.

"Endpoint Detection method for Ion Etching of a Material Having a titanium Nitride Underlayer", Research Disclosure, Feb. 1991, No. 322, Kenneth Mason Publications Ltd. England.

Novellus Damascus Home Page, "12 Steps of Damascus" No Date avail.

S. Matsuo, Reactive ion–beam etching and plasma deposition techniques using electron cyclotron resonance plasma, *Appl. Sol. State Sci*, Academic Press (1985), pp. 75–117 No month avail.

Gorbatkin, et al., Cu metallization using a permanent magnet electron cyclotron resonance microwave plasma sputtering hybrid system, *J. Vac. Sci. Tech*, 14(3) (May/Jun. 1996), pp. 1853–1859.

Park, et al., A novel A–1 reflow process using surface modification by the ECR plasma treatment and its application to the 256Mbit DRAM, *IEDM 94*, 109–112, pp. 5.4.1–5.5.5 (1994) No month avail.

Koenig, et al., RF sputtering system with a variable substrate bias, *IBM Tech, Discl. Bull* 13(2) (Jul. 1970), pp. 323–324.

\* cited by examiner

ECP GAP FILL BY MODULATING THE VOLTATE ON THE SEED LAYER TO INCREASE COPPER CONCENTRATION INSIDE FEATURE

BACKGROUND OF THE INVENTION

1. Field of the Invention

The present invention generally relates to electroplating processes for sub-quarter micron semiconductor devices. More particularly, the present invention relates to electroplating copper into vias of sub-quarter micron semiconductor devices.

2. Description of the Related Art

Sub-quarter micron multi-level metallization is one of the key technologies for the next generation of ultra large scale integration (ULSI). The multilevel interconnects that lie at the heart of this technology require planarization of interconnect features formed in high aspect ratio apertures, including contacts, vias, lines, and other features. Reliable formation of these interconnect features is critical to the success of ULSI and to the continued effort to reliably increase circuit density on individual substrates and die.

As circuit density increases, the widths of vias, contacts, and other features, as well as the width of the dielectric materials positioned therebetween, decreases to less than 250 nanometers, while the thickness of the dielectric layers themselves remains substantially constant. This results in the aspect ratios for the features, i.e., their height divided by width, increasing, often well over 4:1. However, many traditional deposition processes, such as physical vapor deposition (PVD) and chemical vapor deposition (CVD), for example, are known to have difficulty filling high aspect ratio features and structures, particularly when the aspect ratio exceeds 10:1. Therefore, there is a great amount of ongoing effort being directed toward the formation of void-free, nanometer-sized features having high aspect ratios, i.e., 4:1 or higher. Additionally, as the feature width decreases, the device electrical current generally remains constant or increases, which results in an increased current density in the feature.

Elemental aluminum (Al) and several of it's alloys have been the traditional metals used to form lines and plugs in semiconductor processing as a result of aluminum's perceived low electrical resistivity, its superior adhesion to silicon dioxide ($SiO_2$), its ease of patterning, and the availability of aluminum in a relatively pure form. Tungsten and it's alloys have also been a conventional choice for line and plug formation as a result of the resistivity exhibited therefrom. However, aluminum and tungsten both have higher electrical resistivities than other more conductive metals, such as copper, for example, and further, aluminum and tungsten typically offer poor resistance to electromigration.

Copper and its alloys appear to be promising replacements for conventional aluminum and tungsten based processes, as copper generally exhibits lower resistivity than aluminum and tungsten, while also offering significantly higher electromigration resistances than aluminum and tungsten. These characteristics are important for supporting the higher current densities experienced at high levels of integration and increased device speed. Additionally, copper also exhibits favorable thermal conductivity and is readily available in a relatively pure state. Therefore, copper is generally becoming a choice metal for filling sub-quarter micron high aspect ratio interconnect features on semiconductor substrates.

Aside from the desirability for using copper in semiconductor device fabrication, effective fabrication methods for depositing copper into very high aspect ratio features, such as a 4:1 or higher having 0.35 $\mu$ (or less) wide vias are limited, as known deposition techniques, such as PVD and CVD, are generally not effective in completely filling these small vias in copper based systems. Therefore, in order to facilitate the use of copper in semiconductor device fabrication, electroplating processes, which have previously been limited to the fabrication of lines and/or bump solder points, are now being investigated as possible processes for filling vias and contacts on sub-quarter micron semiconductor devices.

Metal electroplating processes are generally known, and may be achieved through a variety of techniques. A typical electroplating method used to manufacture semiconductor devices generally includes using either a CVD or a PVD process to deposit a barrier layer over feature surfaces, using another CVD or PVD process to deposit a conductive metal seed layer over the barrier layer, which is preferably copper, and then electroplating a conductive metal layer over the seed layer to fill the structure/feature. Finally, the deposited layers may then be planarized, through, for example, a chemical mechanical polishing (CMP) process, to remove the overburden and reveal the properly defined and filled conductive interconnect feature.

When copper is used as the conductive material in the electroplating process, a lower resistivity is shown and destructive cross talk is generally reduced. However, the process of electroplating copper into and filling sub-quarter micron vias through conventional electroplating processes has been shown to be unsuccessful, as the limited dimensions of sub-quarter micron vias generally does not allow for sufficient electrolyte flow into and out of the vias to support sustained electroplating. For example, when an electroplating process is used to fill a sub-quarter micron via, the surface containing the via is generally exposed to a flow of electrolyte having the plating material therein. A constant electrical bias is then applied between the electrolyte and the surface to be plated (seed layer), which acts to bias or pull the plating material (ions) from the electrolyte and plate/deposit the ions on the plating surface. However, the plating process depletes plating ions from the electrolyte, and therefore, it is generally necessary to supply fresh electrolyte to the plating surface in order to provide a continual supply of ions to be plated. The supply of fresh electrolyte to flat surfaces to be plated is easily accomplished. However, when it comes to sub-quarter micron vias, it is generally not possible to flow electrolyte into the ion depleted regions of vias as a result of the limited dimensions of the via itself. Therefore, the plating ions must generally diffuse from areas of high ion concentration within the electrolyte outside the vias into areas of lower ion concentration inside the vias in order for the via to be plated or filled. The plating ions are generally caused to diffuse into the vias by the constant electrical plating bias applied between the substrate and the electrolyte, which operates to urge plating ions to diffuse through the electrolyte to areas of lower ion concentration within the electrolyte. Dynamic fluid diffusion principles are the general cause for the diffusion of the plating ions through the electrolyte to areas of low ion concentration. However, fluid diffusion of plating ions from one concentration to another in conventional plating systems is extremely slow and generally impracticable for semiconductor plating processes. Additionally, the diffusion of plating ions as a result of the electrical plating bias is known to be a slow process, as well as potentially causing closure of the vias prior to filling.

Therefore, in view of the deficiencies of conventional plating apparatuses and processes for sub-quarter micron vias, there is a need for a plating apparatus and method capable of accelerating diffusion of plating ions into vias of sub-quarter micron devices. Further, there is a need for a plating apparatus and method capable of accelerating diffusion of plating ions into vias while avoiding closure prior to completely filling the via.

SUMMARY OF THE INVENTION

Embodiments of the invention generally provide a processing cell for an electrochemical deposition system. The processing cell includes a head assembly configured to support a wafer, the head assembly including a cathode, and an electrolyte container configured to hold a fluid electrolyte therein and having an anode disposed within the container. The processing cell further includes a power supply in electrical communication with the cathode and the anode, the power supply being configured provide a pulsed power waveform to the cathode and anode.

Embodiments of the invention further provide an apparatus for electrochemically depositing a metal onto a substrate. The apparatus generally includes a head assembly having a cathode and a wafer holder disposed above the cathode. The apparatus further includes a process kit disposed below the head assembly, the process kit including an electrolyte container configured to receive and maintain a fluid electrolyte therein, and an anode disposed in the electrolyte container. The apparatus further includes a power supply in electrical communication with the cathode and the anode, the power supply being configured to provide a varying amplitude electrical signal to the anode and cathode.

Embodiments of the invention further provide a method for electroplating metal into sub-quarter micron integrated circuit features. The method includes providing an electrolyte container configured to receive and maintain a fluid electrolyte therein, the electrolyte container having an anode disposed within the electrolyte container. The method further includes providing a head assembly positioned above the electrolyte container, the head assembly including a wafer holder for supporting a wafer and a cathode. The method further includes positioning a wafer in the electrolyte container in contact with the fluid electrolyte, and applying a varying amplitude waveform to the cathode and anode in an electroplating process.

Embodiments of the invention further provide a method for electroplating metal including the steps of providing an electrolyte having an anode disposed therein, providing a cathode in electrical communication with a wafer to be plated, and applying a varying amplitude voltage waveform to the cathode and anode in a plating process.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
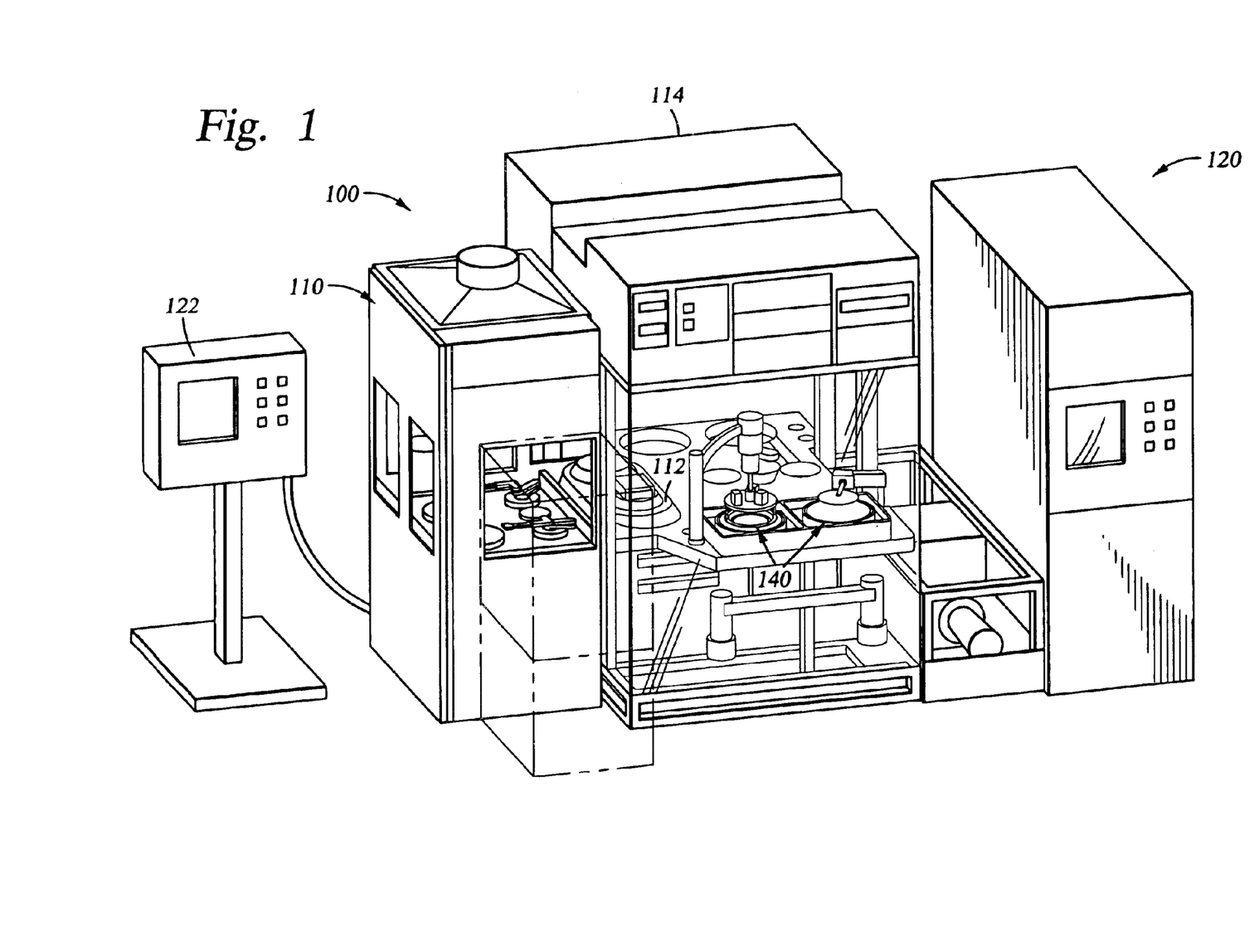
FIG. 1 illustrates a perspective view of an electroplating system of the invention.
Figure 2:
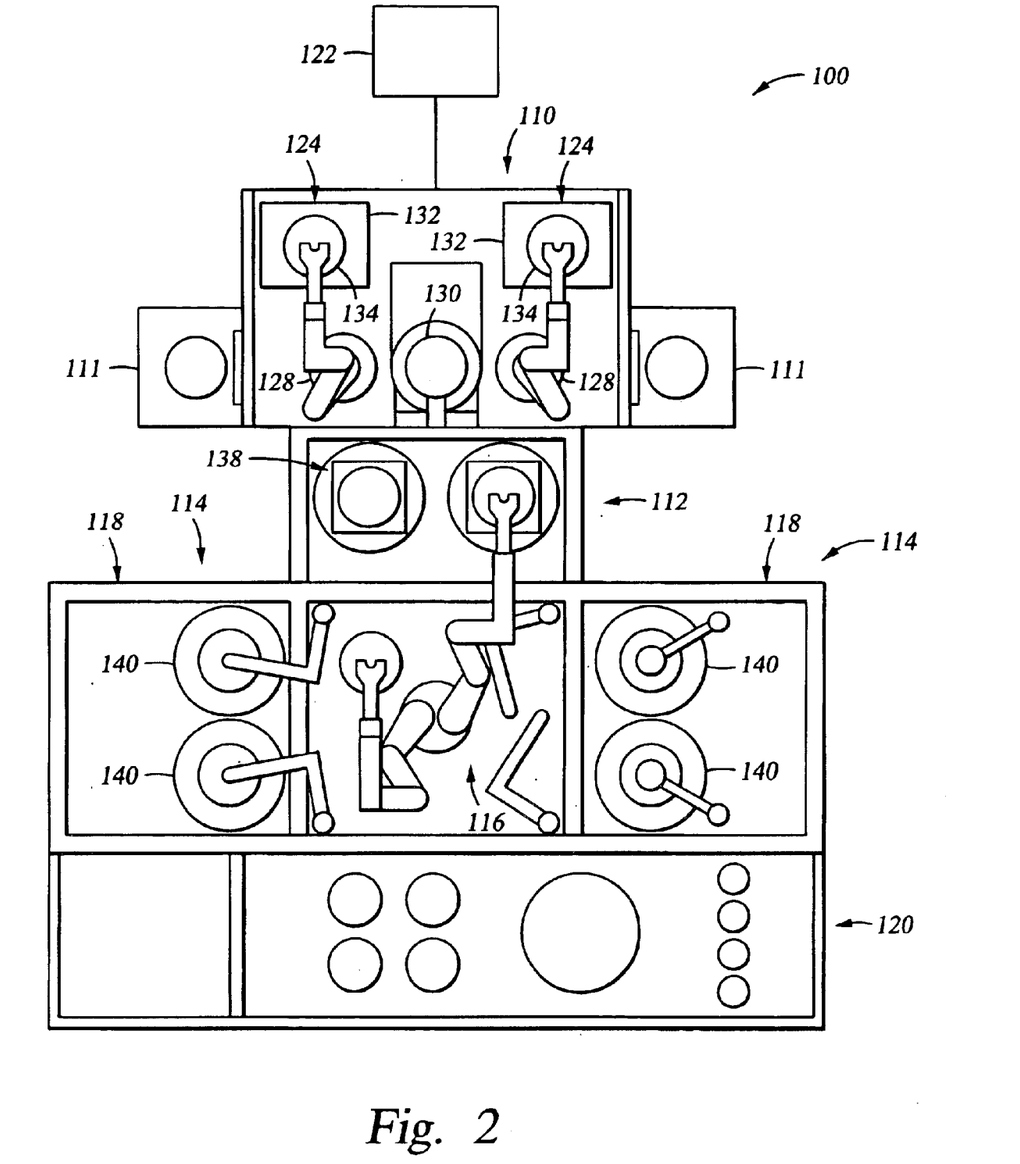
FIG. 2 illustrates a plan view of an electroplating system of the invention.

FIG. 1 is a perspective view of an electroplating system platform 100 of the invention. FIG. 2 is a schematic view of the electroplating system platform 100 of the invention. Referring cooperatively to both FIGS. 1 and 2, the electroplating system platform 100 generally includes a loading station 110, a thermal anneal chamber 111, a spin-rinse-dry (SRD) station 112, a mainframe 114, and an electrolyte replenishing system 120. Preferably, the electroplating system platform 100 is enclosed in a clean room-type environment using, for example, plexiglass panels. The mainframe 114 generally includes a mainframe transfer station 116 and a plurality of processing stations 118. Each processing station 118 includes one or more processing cells 140. An electrolyte replenishing system 120 is positioned adjacent the electroplating system platform 100 and in fluid communication with process cells 140 in order to circulate electrolyte to cells 140 that will be used for the electroplating process. The electroplating system platform 100 also generally includes a control system 122, which may be a programmable microprocessor configured to interface with the various components of the system platform 100 and provide controlling signals thereto. Control system 122 may generally operate to control the cooperative operation of each of the components that together form system platform 100.

Loading station 110 generally includes one or more wafer cassette receiving areas 124, one or more loading station transfer robots 128, and at least one wafer orientor 130. The number of wafer cassette receiving areas 124, loading station transfer robots 128, and wafer orientors 130 included in the loading station 110 may be configured according to the desired throughput of the system. As shown for one exemplary embodiment in FIGS. 1 and 2, the loading station 110 includes two wafer cassette receiving areas 124, two loading station transfer robots 128, and one wafer orientor 130. Wafer cassette 132 containing wafers 134 are loaded onto the wafer cassette receiving area 124 to introduce wafers 134 into the electroplating system platform 100. The loading station transfer robots 128 then transfer wafers 134 between the wafer cassette 132 and the wafer orientor 130. The wafer orientor 130 positions each wafer 134 in a desired orientation to ensure that the wafer 134 is properly processed. The loading station transfer robot 128 also transfers wafers 134 between the loading station 110 and the SRD station 112 and between the loading station 110 and the thermal anneal chamber 111.

Figure 3:
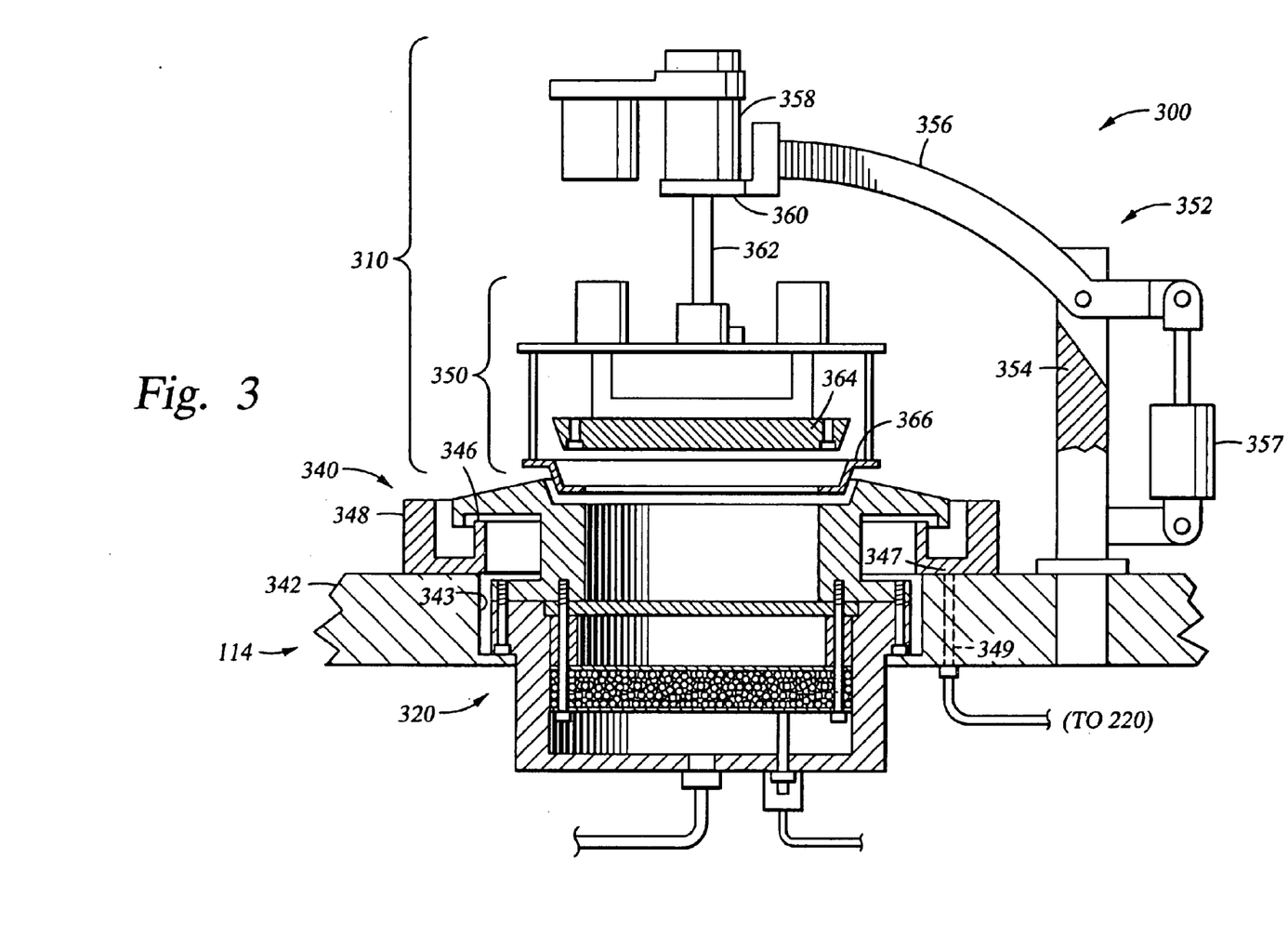
FIG. 3 illustrates a sectional view of an electroplating cell of the invention.

FIG. 3 is a cross sectional view of an electroplating process cell 300 according to the invention. The electroplating process cell 300 is similar to the electroplating process cell 140 as shown in FIGS. 1 and 2. The processing cell 300 generally includes a head assembly 310, a process kit 320 and an electrolyte collector 340. Preferably, the electrolyte collector 340 is secured onto the body 342 of the mainframe 114 over an opening 343 that defines the location for placement of the process kit 320. The electrolyte collector 340 includes an inner wall 346, an outer wall 348, and a bottom 347 connecting the respective walls. An electrolyte outlet 349 is disposed through the bottom 347 of the electrolyte collector 340 and connected to the electrolyte replenishing system 120 (shown in FIG. 1) through tubes, hoses, pipes or other fluid transfer connectors. Process kit 320 also includes an anode positioned within the electrolyte collector 340 so that the anode is in electrical communication with the electrolyte. The anode may be encapsulated within a permeable encapsulation member configured to allow electrolyte flow therethrough, while preventing any plating material from traveling through the permeable encapsulation member.

The head assembly 310 is generally mounted onto a head assembly frame 352. The head assembly frame 352 includes a mounting post 354 and a cantilever arm 356. The mounting post 354 is mounted onto the body 342 of the mainframe 114, and the cantilever arm 356 extends laterally from an upper portion of the mounting post 354. Preferably, the mounting post 354 provides rotational movement with respect to a vertical axis along the mounting post to allow rotation of the head assembly 310. The head assembly 310 is attached to a mounting plate 360 disposed at the distal end of the cantilever arm 356. The lower end of the cantilever arm 356 is connected to a cantilever arm actuator 357, such as a pneumatic cylinder, mounted on the mounting post 354. The cantilever arm actuator 357 provides pivotal movement of the cantilever arm 356 with respect to the joint between the cantilever arm 356 and the mounting post 354. When the cantilever arm actuator 357 is retracted, the cantilever arm 356 moves the head assembly 310 away from the process kit 320 to provide the spacing required to remove and/or replace the process kit 320 from the electroplating process cell 300. When the cantilever arm actuator 357 is extended, the cantilever arm 356 moves the head assembly 310 toward the process kit 320 to position the wafer in the head assembly 310 in a processing position.

The head assembly 310 generally includes a wafer holder assembly 350 and a wafer assembly actuator 358. The wafer assembly actuator 358 is mounted onto the mounting plate 360, and includes a head assembly shaft 362 extending downwardly through the mounting plate 360. The lower end of the head assembly shaft 362 is connected to the wafer holder assembly 350 to selectively position the wafer holder assembly 350 in either a processing position or a wafer loading position. The wafer holder assembly 350 generally includes a wafer holder 364 and a cathode contact ring 366, which is further illustrated in cross section in FIG. 4 as contact ring 466. In general, contact ring 366 includes an annular body having a plurality of conducting members disposed thereon. The annular body is constructed of an insulating material to electrically isolate the plurality of conducting members. Together the body and conducting members form an interior substrate-seating surface, which during processing, supports a substrate and provides electrical communication thereto.

Figure 4:
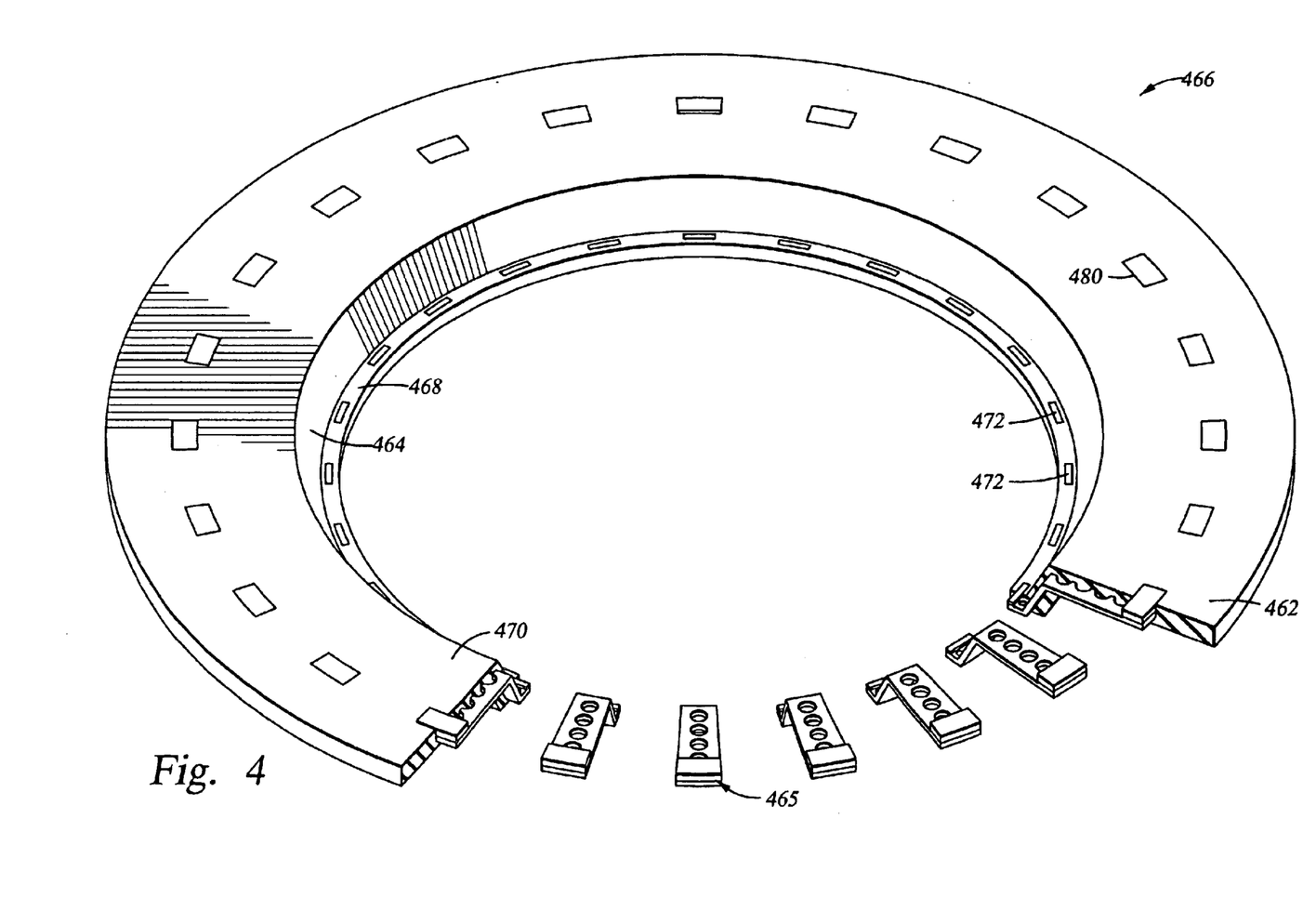
FIG. 4 illustrates three-dimensional partial sectional view of a cathode contact ring of the invention.

FIG. 4 is a perspective view of an exemplary contact ring 466 of the invention having a partial sectional view thereof. Contact ring 466 generally includes a plurality of conducting members 465 at least partially disposed within an annular insulative body 470. The insulative body 470 includes a flange 462 and a downward sloping shoulder portion 464 leading to a substrate seating surface 468 located below the flange 462 such that the flange 462 and the substrate seating surface 468 lie in offset and substantially parallel planes. Thus, the flange 462 may be understood to define a first plane while the substrate seating surface 468 defines a second plane parallel to the first plane, wherein the shoulder 464 is disposed between the two planes. However, the contact ring design shown in FIG. 4 is intended to be merely illustrative, and therefore, various modifications may be made to ring 466 without departing from the scope of the invention. For example, in another embodiment, the shoulder portion 464 may be of a steeper angle including a substantially vertical angle so as to be substantially normal to both the flange 462 and the substrate seating surface 468. Alternatively, the contact ring 466 may be substantially planar thereby eliminating the shoulder portion 464.

The conducting members 465 of contact ring 466 are defined by a plurality of outer electrical contact pads 480 annularly disposed about flange 462, a plurality of inner electrical contact pads 472 radially disposed about the substrate seating surface 468, and a plurality of embedded conducting connectors 476 that link the pads 472, 480 to one another. The conducting members 465 are isolated from one another by the insulative body 470 that may be made of a plastic, such as polyvinylidenefluoride (PVDF), perfluoroalkoxy resin (PFA), Teflon™, and Tefzel™, or other insulating material such as Alumina ($Al_2O_3$) or other ceramics. The outer contact pads 480 are coupled to a power supply (not shown) in order to deliver current and voltage to the inner contact pads 472 via the connectors 476 during processing. In turn, the inner contact pads 472 supply the current and voltage to a substrate by maintaining contact around a peripheral portion of the substrate. Thus, in operation the conducting members 465 act as discrete current paths electrically connected to a substrate.

Low resistivity, and conversely, high conductivity, are directly related to good plating. To ensure low resistivity, conducting members 465 are preferably made of copper (Cu), platinum (Pt), tantalum (Ta), titanium (Ti), gold (Au), silver (Ag), stainless steel, or other conducting materials. Low resistivity and low contact resistance may also be achieved by coating the conducting members 465 with a conducting material. Thus, the conducting members 465 may, for example, be made of copper (resistivity for copper is approximately $2 \times 10^{-8}$ $\Omega \cdot m$) and be coated with platinum (resistivity for platinum is approximately $10.6 \times 10^{-8}$ $\Omega \cdot m$). Coatings such as tantalum nitride (TaN), titanium nitride (TiN), rhodium (Rh), Au, Cu, or Ag on a conductive base materials such as stainless steel, molybdenum (Mo), Cu, and Ti are also possible. Additionally, coating the contacts may also operate to prevent plating on the contacts. Further, since the contact pads 472, 480 are typically separate units bonded to the conducting connectors 476, the contact pads 472, 480 may comprise one material, such as Cu, and the conducting members 465 another, such as stainless steel. Either or both of the pads 472, 180 and conducting connectors 476 may be coated with a conducing material. Additionally, because plating repeatability may be adversely affected by oxidation, which acts as an insulator, the inner contact pads 472 preferably comprise a material resistant to oxidation such as Pt, Ag, or Au.

Typically, one or more power supplies may be in communication with the outer contact pads 480 of the cathode contact ring 466, resulting in parallel circuits through the inner contact pads 472. The power supplies in communication with contact pads 480 will generally be power supplies configured to supply and precisely regulate the voltage and current applied to the contact pads 480. This control may be managed by a microprocessor in communication therewith, or alternatively, through other electronic devices configured to monitor and regulate the output power of the power supplies. Regulated and controlled power supplies is important, as the inner contact pad-to-substrate interface resistance will often vary between each inner contact pad 472. As a result thereof, more current will flow through contact pads 472 having lesser resistances, and therefore, more plating will occur proximate these particular contact pads 472 having lower resistances. However, by placing an external resistor in series with each conducting member 465, the value or quantity of electrical current passed through each conducting member 465 may be controlled by adjusting the value of the external resistor. This control process may be undertaken by the power supply controller, or alternatively, by a separate electronic device configured to monitor and adjust the variable resistor in order to maintain a constant voltage and current through contacts pads 472. As a result of the control process of the invention, the variations in the electrical properties between each of the inner contact pads 472 do not affect the current distribution on the substrate, and a uniform current density results across the plating surface that contributes to a uniform plating thickness. The external variable resistors may also allow and provide for a uniform current distribution between different substrates of a process-sequence.

The following is a description of a typical wafer electroplating process sequence through the exemplary electroplating system platform 100 shown in FIG. 1. A wafer cassette containing a plurality of wafers is loaded into the wafer cassette receiving area 124 in the loading station 110 of the electroplating system platform 100. A loading station transfer robot 128 picks up a wafer from a wafer slot in the wafer cassette and places the wafer on the wafer orientor 130. The wafer orientor 130 determines and orients the wafer to a desired orientation for processing through the system 100. The loading station transfer robot 128 then transfers the oriented wafer from the wafer orientor 130 and positions the wafer in one of the wafer slots in the wafer pass-through cassette 138 in the SRD station 112. The mainframe transfer robot 142 picks up the wafer from the wafer pass-through cassette 138 and positions the wafer for transfer by the flipper robot 148. The flipper robot 148 rotates its robot blade below the wafer and picks up wafer from mainframe transfer robot blade. A vacuum suction gripper on the flipper robot blade secures the wafer on the flipper robot blade, and the flipper robot flips the wafer from a face up position to a face down position. The flipper robot 148 rotates and positions the wafer face down in the wafer holder assembly 350. The wafer is positioned below the wafer holder 364 but above the cathode contact ring 466. The flipper robot 148 then releases the wafer to position the wafer into the cathode contact ring 466. The wafer holder 364 moves toward the wafer and the vacuum chuck secures the wafer on the wafer holder 364. A bladder assembly on the wafer holder assembly 450 exerts pressure against the wafer backside to ensure electrical contact between the wafer plating surface and the cathode contact ring 466.

The head assembly 452 is lowered to a processing position above the process kit 320. At this position the wafer is below the upper plane of a weir and contacts the electrolyte contained in the process kit 320. A power supply is activated to supply electrical power (i.e., voltage and current) to the cathode and the anode to enable the electroplating process. The electrical power supplied is traditionally a constant voltage and current, and the electrolyte in the processing kit 320 is typically continually pumped into the process kit 320 during the electroplating process. The electrical power supplied to the cathode and anode and the flow of the electrolyte are controlled by a control system to achieve the desired electroplating results. The combination of the electrolyte, which is rich in plating ions, and a constant electrical bias being applied to the plating surface allows for the plating ions to be deposited/plated on the plating surface. Additionally, the head assembly may be rotated as the head assembly is lowered and also during the electroplating process.

After the electroplating process is completed, the head assembly 410 raises the wafer holder assembly 450 and removes the wafer from the electrolyte. Preferably, the head assembly 452 is rotated for a period of time to enhance removal of residual electrolyte from the wafer holder assembly 450. The vacuum chuck and the bladder assembly of the wafer holder then release the wafer from the wafer holder, and the wafer holder is raised to allow the flipper robot blade 148 to pick up the processed wafer from the cathode contact ring 466. The flipper robot 148 rotates the flipper robot blade above the backside of the processed wafer in the cathode contact ring 466 and picks up the wafer using the vacuum suction gripper on the flipper robot blade. The flipper robot 148 rotates the flipper robot blade with the wafer out of the wafer holder assembly, flips the wafer from a face-down position to a face-up position, and positions the wafer on the mainframe transfer robot blade. The mainframe transfer robot then transfers and positions the processed wafer above the SRD module 136 for drying. After drying, the loading station transfer robot 228 picks up the wafer from the SRD module 136 and transfers the processed wafer into the RTA chamber 111 for an anneal treatment process to enhance the properties of the deposited materials. The annealed wafer is then transferred out of the RTA chamber 111 by the loading station robot 128 and placed back into the wafer cassette for removal from the electroplating system. The above-described sequence can be carried out for a plurality of wafers substantially simultaneously in the electroplating system platform 100 of the present invention. Also, the electroplating system according to the invention may be adapted to provide multi-stack wafer processing.

Embodiments of the invention improve upon conventional plating processes and apparatuses via application of a varied amplitude electrical bias waveform, i.e., a pulsed or modulated electrical bias waveform, to the plating surface. More particularly, conventional power application processes generally apply a constant electrical bias to the plating surface in order to draw ions from the electrolyte to the plating surface. The pulsed or modulated bias, which may be pulsed in a square wave, saw tooth wave, sinusoidal wave, other waveforms having generally oscillatory type characteristics, or variations thereof, generally uses increased voltage magnitude on the positive/upper portions of the pulses in order to encourage diffusion of plating ions deep into sub-quarter micron features, while also using low magnitude voltage on the lower/negative portions of the pulses. The lower/negative portion of the power pulses operate to plate at lower current density for a period of time, which facilitates avoidance of plating closure of the top of the features. Therefore, the pulsed bias to the plating surface operates to both facilitate diffusion of plating ions into the lower portions of smaller features, while also avoiding close of the feature top opening from overplating.

Figure 5:
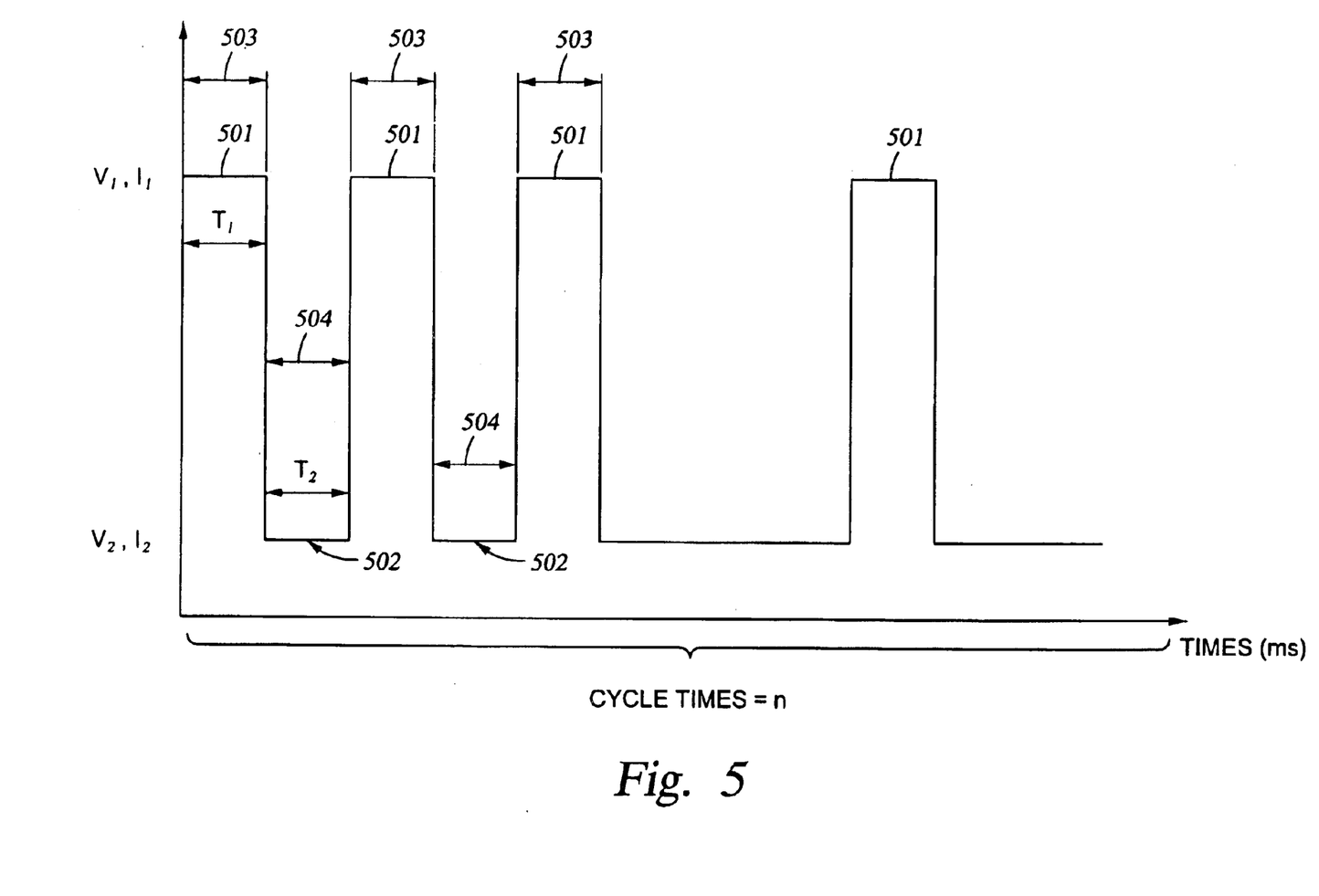
FIG. 5 illustrates an exemplary time/voltage plot for an electroplating voltage of an embodiment of the invention.

FIG. 5 illustrates an exemplary electroplating voltage bias application 500. The voltage bias application 500, although represented as a square wave in the current exemplary embodiment, is not limited to any specific waveform. Voltage bias 500 includes a sequence of large magnitude positive voltage bias portions 501 and low magnitude positive voltage bias portions 502. The high and low voltage portions are sequentially applied in an alternating sequence, i.e., high, low, high, low, etc. The high voltage portions 501 may be, for example, in the range of about 5 volts to about 10 volts. Alternatively, the high voltage portions may be in the range of about 2 volts to about 15 volts, for example, for a 200 millimeter substrate. The current density of the high voltage portions may be in the range of about 8 milliamps per square centimeter to about 50 milliamps per square centimeter. More particularly, the current density of the high voltage portions may be in the range of about 16 milliamps per square centimeter to about 32 milliamps per square centimeter. The low voltage portions 502 may be, for example, in the range of about 0.3 volts to about 1.5 volts. Alternatively, the low voltage portions may be between about 0 volts and about 2 volts. The duration of the high voltage pulse 501, which is represented by 503 in FIG. 5, may be between about 50 milliseconds and about 500 milliseconds in duration, for example. The duration of the low voltage pulse 502, which is represented by 504 in FIG. 5, may be between about 50 milliseconds and about 500 milliseconds, for example. Therefore, the combination of the high voltage pulse duration and high voltage magnitude may be calculated to maximize ion diffusion into sub-quarter micron features, as the high voltage parameters may be calculated to drive or attract plating ions into the vias for plating during the low voltage portions. The combination of the low voltage pulse duration and low voltage magnitude may be calculated to optimize plating in sub-quarter micron features without causing closure of the features prior to the feature being completely filled with plating material. The combination of the high and low voltage portions cooperatively operate to diffuse the maximum number of plating ions into the vias and to plate these ions without causing a top closure condition prior to completely filling the via. The present exemplary embodiment may sequentially apply the high and low voltage pulses to the surface to be plated for a predetermined number of cycles (a cycle equals one sequence of a high pulse followed by a low pulse), which may be between about 5 cycles and about 50 cycles.

In yet another exemplary embodiment of the invention, the bias voltage application may be modified to include a pulsed or modulated voltage sequence, wherein a sequence of large magnitude voltage portions and low magnitude negative voltage portions are applied to the plating surface. In this exemplary embodiment the large magnitude voltage portions may be in the range of about 2 volts to about 15 volts, and preferably in the range of about 5 volts to about 10 volts. The low voltage portions may be in the range of about negative 0.1 volts to about negative 2 volts, and preferably in the range of about negative 0.3 volts to about negative 1.5 volts. In this embodiment the high voltage portions are calculated to encourage electrolyte ion diffusion into the sub-quarter micron features. Additionally, the low voltage portions are calculated to facilitate void free gap fill by avoiding closure of sub-quarter micron features through slower plating during the lower voltage portions, however, the low voltage portions may be negative in the present exemplary embodiment, which may operate to substantially reduce and/or reverse the plating process in order to prevent voids in the gap fill.

While the foregoing is directed to embodiments of the present invention, other and further embodiments of the invention may be devised without departing from the basic scope thereof, and the scope thereof is determined by the claims that follow.

What is claimed is:

1. A method for electroplating metal into sub-quarter micron integrated circuit features, comprising:
providing an electrolyte container configured to receive and maintain a fluid electrolyte therein, the electrolyte container having an anode disposed within the electrolyte container;
providing a head assembly positioned above the electrolyte container, the head assembly including a wafer holder for supporting a wafer and a cathode;
positioning a wafer in the electrolyte container in contact with the fluid electrolyte; and
applying a varying amplitude waveform to the cathode and anode in an electroplating process, the varying amplitude waveform comprising a small magnitude voltage pulse and a large magnitude voltage pulse, the large magnitude voltage pulse generating a current density to the cathode of between about 8 milliamps per square centimeter and about 50 milliamps per square centimeter.

2. The method of claim 1, wherein applying the cyclical waveform further comprises applying the cyclical waveform between about 5 cycles per second and about 50 cycles per second.

3. The method of claim 1, wherein the varying amplitude waveform further comprises at least one of a square voltage waveform, a saw tooth voltage-waveform, a triangular voltage waveform, and a sinusoidal voltage waveform.

4. The method of claim 1, wherein the large magnitude voltage pulses have a voltage of between about 2 volts to about 15 volts.

5. The method of claim 1, wherein the large magnitude voltage pulses have a voltage of between about 5 volts to about 10 volts.

6. The method of claim 1, wherein the small magnitude voltage pulses have a voltage of between about 0 volts to about 2 volts.

7. The method of claim 1, wherein the small magnitude voltage pulses have a voltage of between about 0.3 volts to about 1.5 volts.

8. The method of claim 1, wherein the small magnitude voltage pulses have a voltage of between about negative 0.1 volts to about negative 2 volts.

9. The method of claim 1, wherein the large magnitude voltage pulses are configured to supply a current density to the cathode of between about 16 milliamps per square centimeter and about 32 milliamps per square centimeter.

10. The method of claim 1, wherein the large magnitude voltage pulses have a duration of between about 50 milliseconds and about 500 milliseconds.

11. The method of claim 1, wherein the small magnitude voltage pulses have a duration of between about 50 milliseconds and about 500 milliseconds.

12. A method for electroplating metal, comprising:
providing an electrolyte having an anode disposed therein;
providing a cathode in electrical communication with a wafer to be plated; and
applying a varying amplitude voltage waveform to the cathode and anode in a plating process, the varying amplitude waveform comprising a series of alternating large magnitude voltage pulses and small magnitude voltage pulses, the large magnitude voltage pulses being configured to generate a current density on the wafer of between about 8 mA/cm$^2$ and about 50 8 mA/cm$^2$.

13. The method of claim 12, wherein applying the cyclical waveform further comprises applying the cyclical waveform between about 5 cycles per second and about 50 cycles per second.

14. The method of claim 12, wherein the varying amplitude waveform further comprises at least one of a square voltage waveform, a saw tooth voltage waveform, a triangular voltage waveform, and a sinusoidal voltage waveform.

15. The method of claim 12, wherein the large magnitude voltage pulses have a voltage of between about 2 volts to about 15 volts.

16. The method of claim 12, wherein the large magnitude voltage pulses have a voltage of between about 5 volts to about 10 volts.

17. The method of claim 12, wherein the small magnitude voltage pulses have a voltage of between about 0 volts to about 2 volts.

18. The method of claim 12, wherein the small magnitude voltage pulses have a voltage of between about 0.3 volts to about 1.5 volts.

19. The method of claim 12, wherein the small magnitude voltage pulses have a voltage of between about negative 0.1 volts to about negative 2 volts.

20. The method of claim 12, wherein the large magnitude voltage pulses are configured to supply a current density to the cathode of between about 8 milliamps per cubic centimeter and about 50 milliamps per cubic centimeter.

21. The method of claim 12, wherein the large magnitude voltage pulses are configured to supply a current density to the cathode of between about 16 milliamps per cubic centimeter and about 32 milliamps per cubic centimeter.

22. The method of claim 12, wherein the large magnitude voltage pulses have a duration of between about 50 milliseconds and about 500 milliseconds.

23. The method of claim 12, wherein the small magnitude voltage pulses have a duration of between about 50 milliseconds and about 500 milliseconds.

24. A method for electroplating a conductive material onto a substrate, comprising:

positioning the substrate in an electroplating cell, the electroplating cell comprising an anode positioned in electrical communication with a plating solution;

electrically contacting a plating surface of the substrate with a cathode electrode;

immersing the plating surface in the plating solution; and applying a plating bias between the anode and the cathode, the plating bias comprising an interchanging cathodic series of large magnitude and small magnitude pulses, the large magnitude pulses generating a current density of between about 8 mA/cm$^2$ and about 50 mA/cm$^2$ across the plating surface.

25. The method of claim 24, wherein the large magnitude pulses and the small magnitude pulses comprise a duration of between about 50 ms and about 500 ms per pulse.

26. The method of claim 24, wherein the current density further comprises between about 16 mA/cm$^2$ and about 32 mA/cm$^2$.

27. The method of claim 24, wherein the small magnitude-voltage pulses have a voltage of between about 0.3 volts to about 1.5 volts.

28. The method of claim 24, wherein the large magnitude voltage pulses have a voltage of between about 5 volts and about 10 volts.

* * * * *

UNITED STATES PATENT AND TRADEMARK OFFICE
CERTIFICATE OF CORRECTION

| | | |
|---|---|---|
| PATENT NO. | : 6,746,591 B2 | |
| APPLICATION NO. | : 09/981508 | |
| DATED | : June 8, 2004 | |
| INVENTOR(S) | : Bo Zheng, Renren He and Girish Dixit | |

It is certified that error appears in the above-identified patent and that said Letters Patent is hereby corrected as shown below:

On the cover page in the Title, change "Voltate" to --Voltage--, to read --ECP GAP FILL BY MODULATING THE VOLTAGE ON THE SEED LAYER TO INCREASE COPPER CONCENTRATION INSIDE FEATURE--;

The Abstract should read:

> A method for electro-chemically depositing a metal onto a substrate. The method generally includes providing an electrolyte container configured to receive and maintain a fluid electrolyte therein, the electrolyte container having an anode disposed within the electrolyte container, providing a head assembly positioned above the electrolyte container, the head assembly including a wafer holder for supporting a wafer and a cathode, and positioning a wafer in the electrolyte container in contact with the fluid electrolyte, and applying a varying amplitude waveform to the cathode and anode in an electroplating process.

Column 1, line 2, in the Title, change "Voltate" to -- Voltage --;

Column 1, line 43, change "it's" to --its--;

Column 1, line 49, change "it's" to --its--;

Column 3, line 19, insert --to-- after "configured";

Column 6, line 52, change "conducing" to -- conducting--;

Column 10, in Claim 12, line 66, delete "8" after "50";

Signed and Sealed this

Fourteenth Day of August, 2007

JON W. DUDAS
*Director of the United States Patent and Trademark Office*